United States Patent [19]

Ohi et al.

[11] Patent Number: 5,235,207

[45] Date of Patent: Aug. 10, 1993

[54] SEMICONDUCTOR DEVICE

[75] Inventors: Eiji Ohi, Kawagoe; Hiromichi Suzuki, Tokorozawa; Gen Murakami, Tama, all of Japan

[73] Assignee: Hitachi, Ltd., Tokyo, Japan

[21] Appl. No.: 985,239

[22] Filed: Dec. 2, 1992

Related U.S. Application Data

[63] Continuation of Ser. No. 733,661, Jul. 22, 1991, abandoned.

[30] Foreign Application Priority Data

Jul. 20, 1990 [JP] Japan .................. 2-192220
Nov. 29, 1990 [JP] Japan .................. 2-332648

[51] Int. Cl.⁵ .......................... H01L 23/48
[52] U.S. Cl. .................. 257/670; 257/672; 257/675; 257/676
[58] Field of Search ............. 357/70; 257/670, 672, 257/675, 676

[56] References Cited

U.S. PATENT DOCUMENTS 4,801,999 1/1989 Hayward et al. ............... 357/70
4,862,245 8/1989 Pashby et al. .................. 357/70
4,967,261 10/1990 Niki et al. ...................... 357/70

Primary Examiner—Edward Wojciechowicz
Attorney, Agent, or Firm—Antonelli, Terry, Stout & Kraus

[57] ABSTRACT

A semiconductor device having a semiconductor chip that has a square main surface in which a plurality of elements are formed on the main surface of the chip, and in which first and second bonding pads are arranged along the periphery of the main surface. A plurality of first leads are provided in which the first and second ends thereof are positioned outside of the semiconductor chip. A second lead is also provided that extends on the main surface of the semiconductor chip and extends to the outside of the semiconductor chip. The device is additionally provided with electrical connections between the first bonding pads and the first ends of the first leads, second electrical connections between the second bonding pads and the second lead and a sealing material that covers the semiconductor chip, the first leads, a portion of the second lead, and the first and second electrical connections.

15 Claims, 13 Drawing Sheets

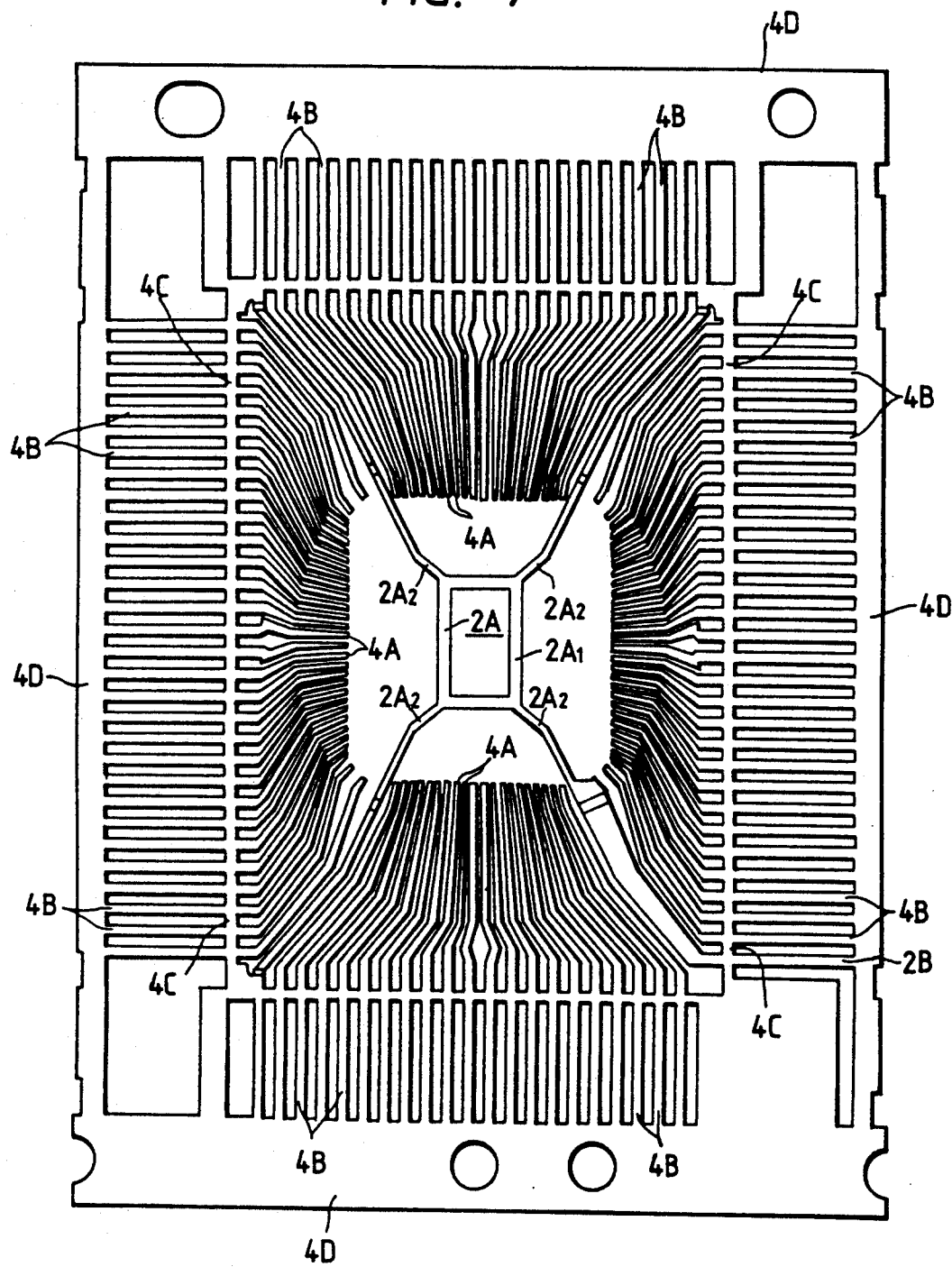

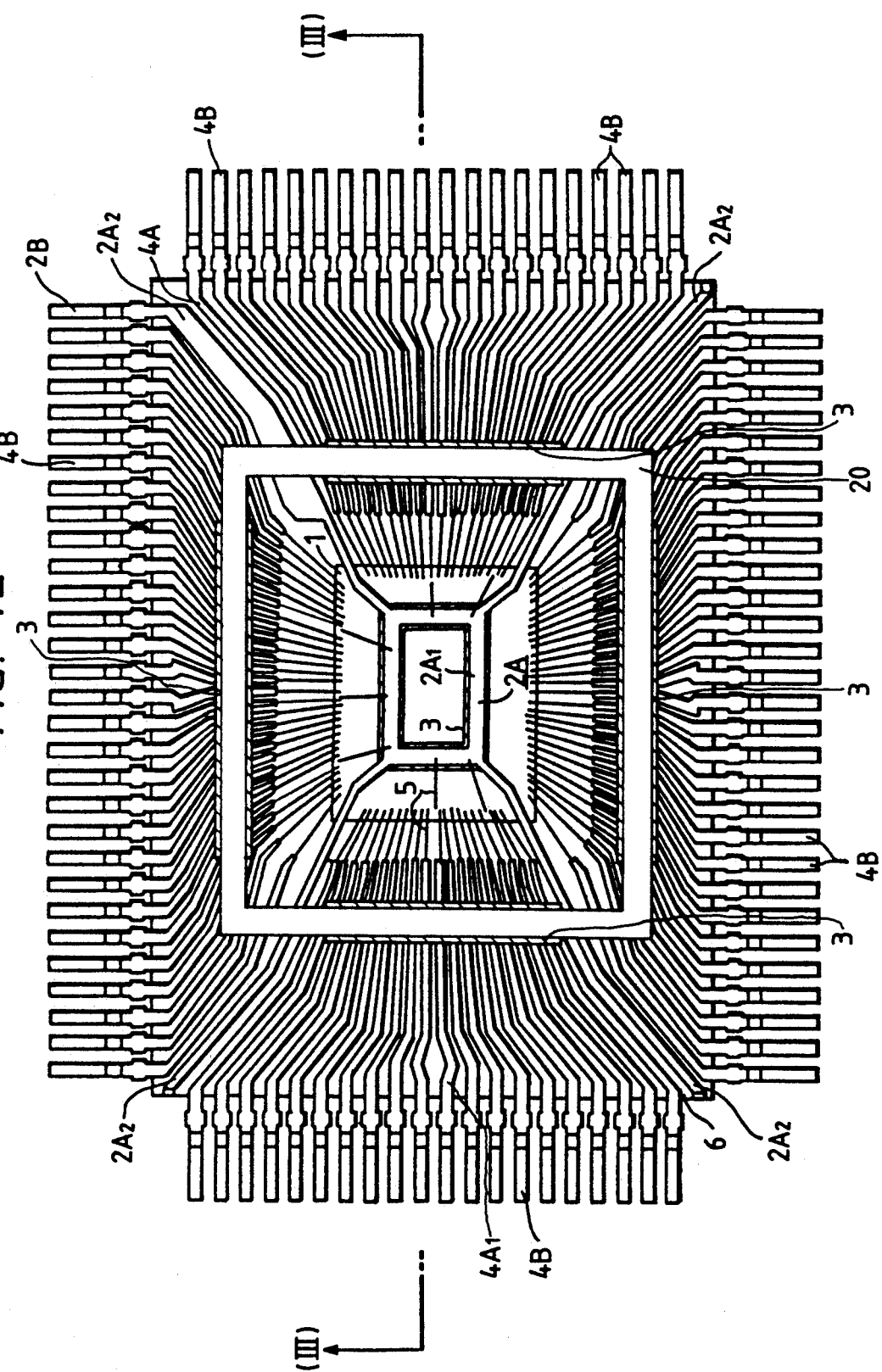

SEMICONDUCTOR DEVICE

This application is a continuation of application Ser. No. 733,661, filed on Jul. 22, 1991 now abandoned.

BACKGROUND OF THE INVENTION

The present invention relates to a semiconductor device, and particularly to technology that can be effectively adapted to a multi-pin semiconductor package in which a semiconductor chip consisting of a large-scale integration circuit having a high degree of integration is molded with a sealing material.

Heretofore semiconductor chips have been protected basically by being molded with a resin.

For instance, there is a technology in which use is made of a lead frame having a central portion thereof called a tab on which a semiconductor chip is to be mounted. Regarding such mounting technology, the semiconductor chip is first mounted on the tab and then the entire device is molded with a sealing material composed of the resin. According to this prior art technique, bonding pads arranged along the periphery on the main surface of the semiconductor chip are connected to the corresponding inner leads via, for example, bonding wires.

A problem common in the semiconductor packages of the prior art is that the sealing material is cracked at the portions where the leads of the metallic lead frame protrude beyond the sealing material, i.e., the sealing material is cracked along the parting line of the metal mold.

Another problem is that pollutants such as Na+ ions in the environment infiltrate into the semiconductor chip from the external side along the boundary between the leads and the resin when the semiconductor chip is constructed in a large size, and the passage of infiltration becomes relatively short as the size of the semiconductor chip becomes great. That is, pollutants infiltrate easily.

There further exists a problem in that relatively long bonding wires are necessary to connect the inner leads to the bonding pads of the semiconductor chip.

In order to solve the above-mentioned problems, there has been proposed a semiconductor device, such as semiconductor device of the LOC (lead-on-chip) structure, in which a plurality of inner leads are adhered onto the circuit-forming surface of a semiconductor chip using an adhesive agent via an insulating film, said inner leads are electrically connected to the semiconductor chip via bonding wires, and the device is molded with a resin, and in which a common inner lead (bus-bar inner lead) is provided near the center line on the circuit-forming surface of the semiconductor chip in the lengthwise direction (U.S. Pat. No. 4,862,245 assigned to International Business Machines Co.).

SUMMARY OF THE INVENTION

The present inventors have studied the above-mentioned prior art but have found the problems as described below.

In electrically connecting the inner leads to the semiconductor chip using bonding wires, it becomes necessary that the wires bonded to the inner signal leads must jump over the common inner lead that is located between the bonding pads on the semiconductor chip and the inner signal leads. In this case, the loops of bonding wires must be higher than the ordinary wires in order to prevent the short-circuiting between the bonding wires and the common inner lead. This makes it difficult to reduce the thickness of the sealing material.

When the number of leads is as small as, for example, twenty to thirty as in the case of a memory, it is allowed to arrange the bonding pads in line along the central portion on the circuit-forming surface of the semiconductor chip. In the case of a logic semiconductor device such as ASIC (application specific integrated circuit), however, the number of leads becomes greater than, for example, fifty.

In the case of the semiconductor device having such a large number of pins, it is not allowed to arrange the bonding pads along the central portion on the circuit-forming surface of the semiconductor chip.

With the multi-pin semiconductor device, it is not allowed to arranged a number of pads maintaining a predetermined gap on the circuit-forming surface of the semiconductor chip. In other words, limitation is imposed on the number of leads that can be arranged on the circuit-forming surface of the semiconductor chip.

Therefore, it is not possible to realize a multi-pin semiconductor device.

It is an object of the present invention to provide a highly reliable semiconductor device.

Another object of the present invention is to provide a semiconductor device having reduced thickness.

A further object of the present invention is to provide a multi-pin semiconductor device.

A still further object of the present invention is to provide technology for preventing the semiconductor device from erroneous operation that may be caused by a change in the power source potential or in the reference potential.

Yet a further object of the present invention is to provide a semiconductor device which has a reduced thickness, an increased number of pins, and which is prevented from erroneously operating.

The above and other objects as well as novel features of the present invention will become apparent from the description of the specification and the accompanying drawings.

Among the inventions disclosed in this application, only representative examples will be described below briefly.

(1) A semiconductor device comprising a semiconductor chip having a square main surface, a plurality of elements on the main surface, and first and second bonding pads arranged along the peripheral portion of the main surface; a plurality of first leads each having first and second ends which are located outside the semiconductor chip; a second lead that runs on the main surface of the semiconductor chip and extends toward the outside of the semiconductor chip; first connection means that electrically connects the first bonding pads to the first ends of the first leads; second connection means that connects the second bonding pads to the second lead, and a sealing material that covers the semiconductor chip, part of the first and second leads, and the first and second connection means.

(2) The second lead is located on the semiconductor chip on a part thereof more inwardly than that of the first and second bonding pads.

(3) A reference potential is applied to the second lead.

(4) A semiconductor device comprising a semiconductor chip having a square main surface, a plurality of elements on the main surface, and first and second bonding pads arranged along the periphery of the square main surface; a sealing material covering the semiconductor chip; a plurality of first leads each having first and second ends, and extending in directions perpendicular to the four sides of the square semiconductor chip, said first ends being located near said semiconductor chip, and said second ends being located on the outside of said sealing member; a second lead running on the main surface of said semiconductor chip to extend toward the outside of said semiconductor chip; a third lead that is located inside said sealing material, that extends in a direction substantially perpendicular to said first leads, and that is electrically connected to said second lead; first connection means that is positioned inside said sealing material to electrically connect said first bonding pads to the first ends of said first leads; and second connection means that is positioned inside said sealing material to connect said second bonding pads to said second lead; wherein said third lead is electrically connected to at least one of said first leads.

According to the above-mentioned means (1), the first leads and the second lead are positioned in opposing directions with respect to the bonding pads, whereby means connecting the first leads to the first bonding pads is prevented from being short-circuited to the second lead, and a highly reliable semiconductor device is provided. Moreover, a semiconductor device having a reduced thickness is provided since the first leads and the second lead are positioned in the opposing directions with respect to the bonding pads. Further, a multi-pin semiconductor device is provided since the bonding pads are arranged along the periphery of the semiconductor chip.

According to the above-mentioned means (2), any semiconductor chip can be mounted provided it has such an outer shape that the second lead is positioned on a part of the chip relatively more inwardly than that of the first and second bonding pads and is further positioned relatively inwardly inside of that of the first ends of the first leads. Therefore, plural kinds of semiconductor chips having different functions and sizes can be mounted, and a semiconductor device of a low cost can be realized in short periods of time.

According to the above-mentioned means (3), the second lead running on the semiconductor chip and the second bonding pads are connected together, and a reference potential is applied to the second lead, making it possible to prevent the semiconductor device from erroneously operating despite a change in the reference potential.

According to the above-mentioned means (4), a first lead at a given position is electrically connected to the third lead, enabling the lead served with the power source potential or with the reference potential to be set to any position, contributing to increasing the degree of freedom in mounting the semiconductor device on a printed board.

BRIEF DESCRIPTION OF THE DRAWINGS

FIG. 7 is a plan view showing the constitution of a lead frame according to the first embodiment;

FIG. 12 is a diagram showing an example to which the present invention is applied.

DESCRIPTION OF THE PREFERRED EMBODIMENTS

Figure 1:
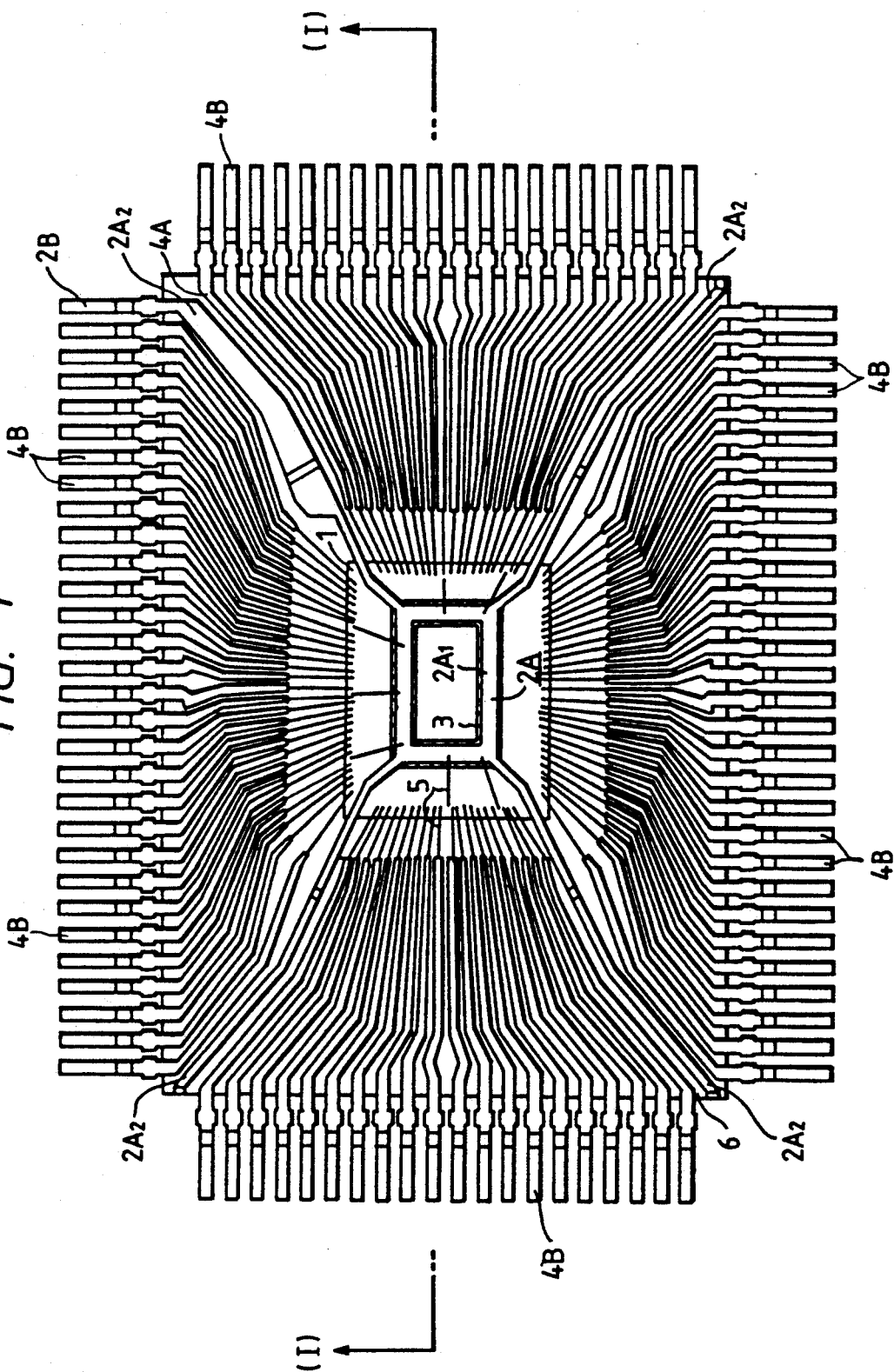
FIG. 1 is a plan view showing the whole constitution of a resin-molded semiconductor device according to a first embodiment of the present invention from which the upper half of the molded resin is removed.

An embodiment of the present invention will now be described in detail in conjunction with the drawings.

In the drawings explaining the embodiments, those portions having the same functions are denoted by the same reference numerals but are not described repetitively.

Embodiment 1

Figure 2:
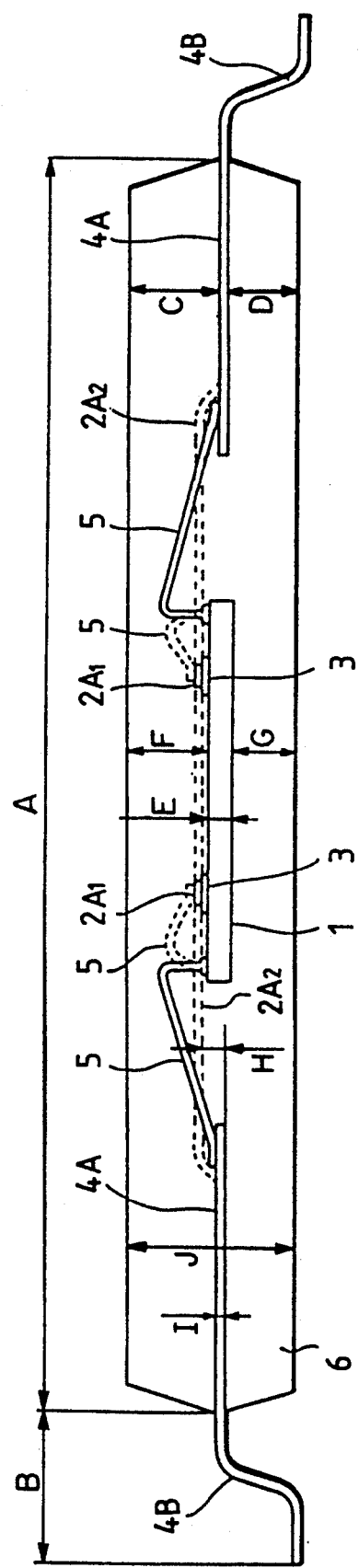
FIG. 2 is a section view cut along the line (I)—(I) of FIG. 1.
Figure 3:
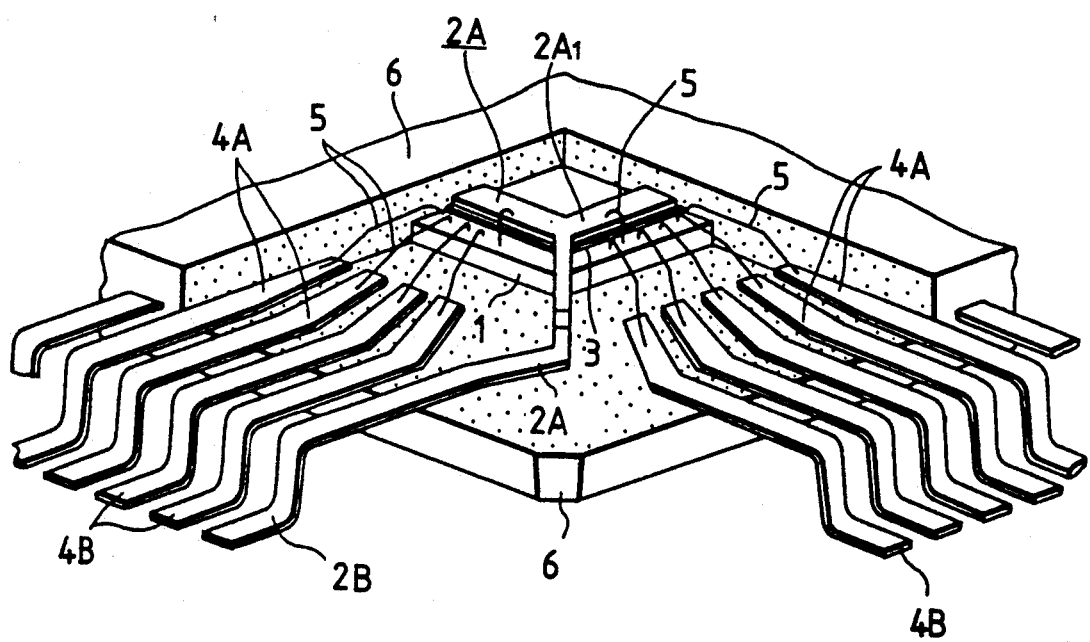
FIG. 3 is a partly cut-away perspective view which explains major portions of the resin-molded semiconductor device according to the first embodiment of FIG. 1.
Figure 4:
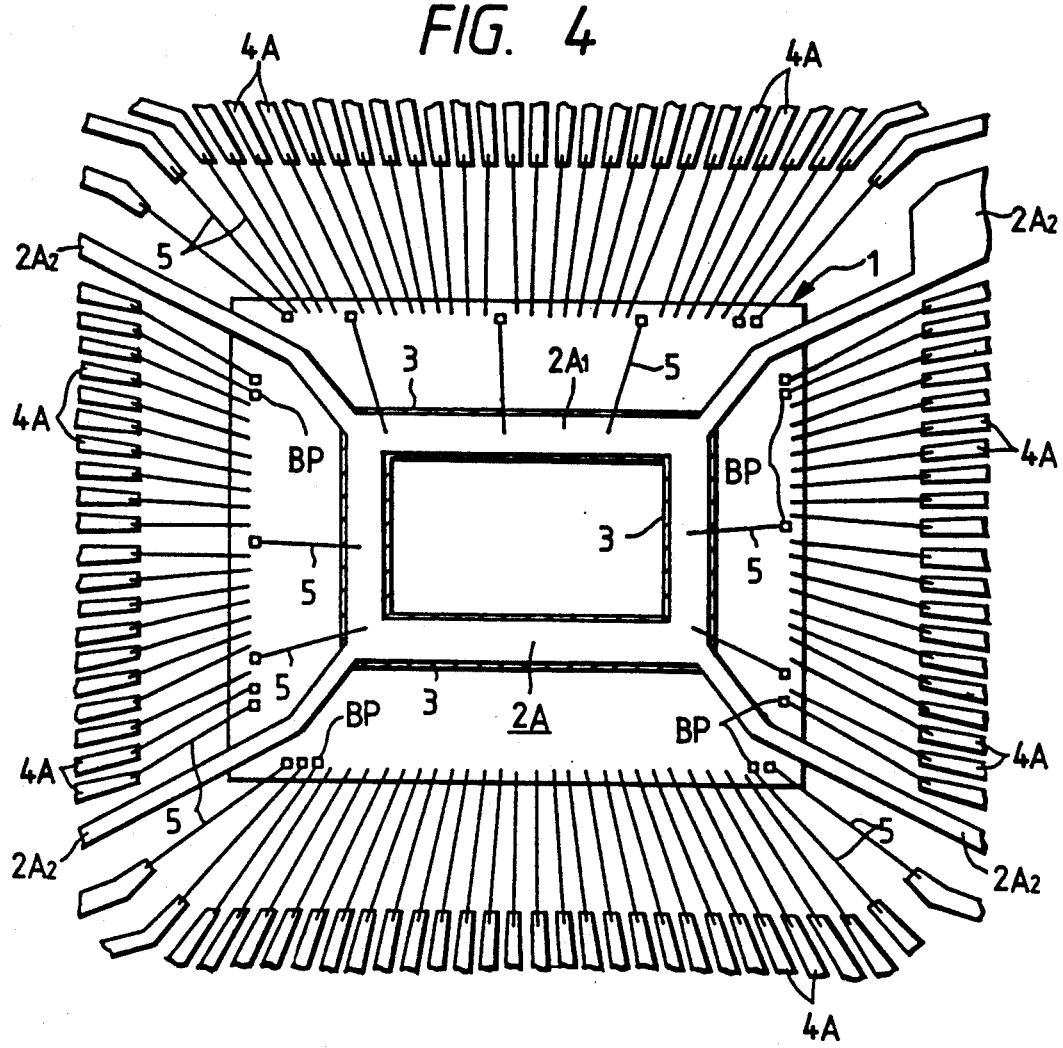
FIG. 4 is a diagram showing major portions of FIG. 1 on an enlarged scale.
Figure 5:
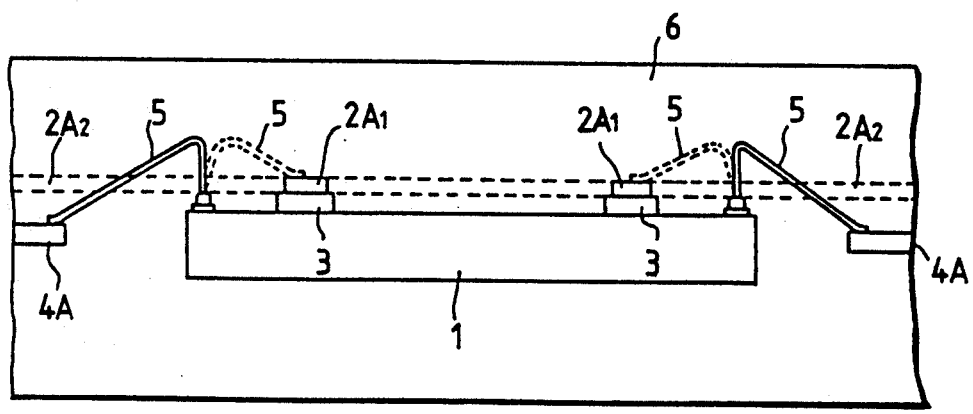
FIG. 5 is a diagram showing major portions of FIG. 2 on an enlarged scale.
Figure 6A:
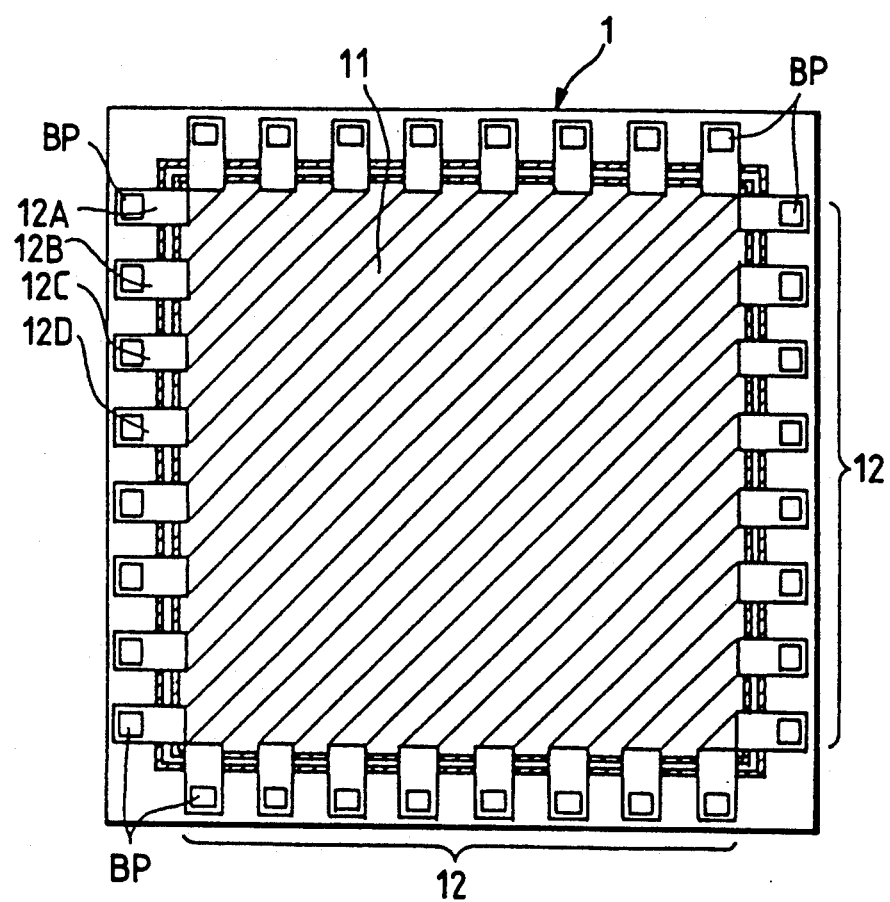
FIGS. 6A and 6B are plan views showing layouts of a semiconductor chip according to the first embodiment.
Figure 6B:
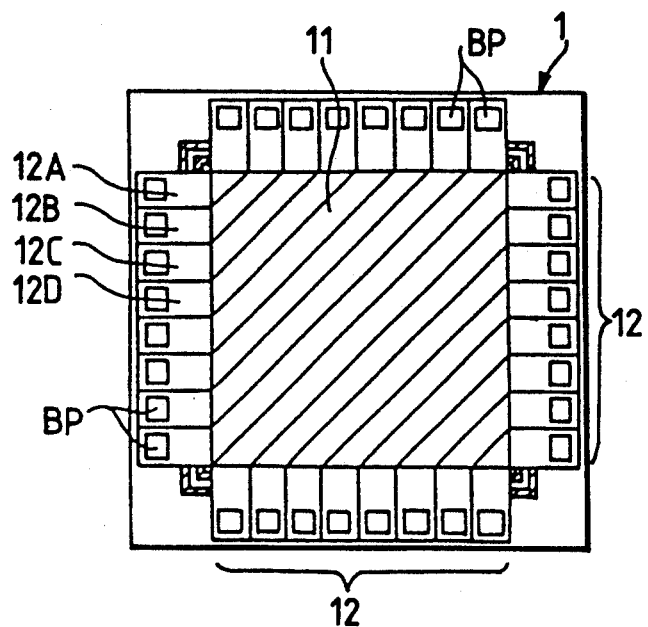
Figure 6C:
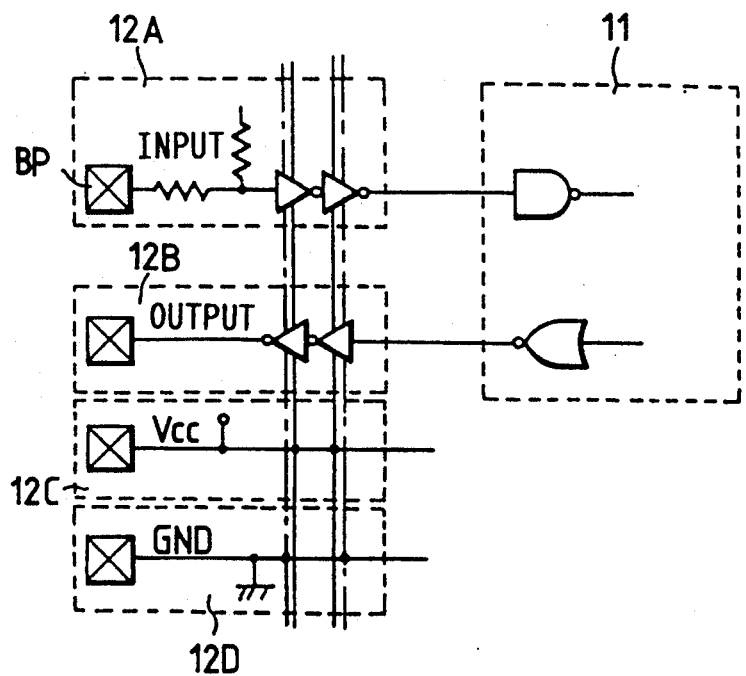
FIG. 6C is a block diagram showing major portions of FIGS. 6A and 6B.

FIG. 1 is a plan view showing the whole constitution of a resin-molded semiconductor device according to a first embodiment of the present invention from which the upper half of the molded resin is removed;

FIG. 2 is a section view cut along the line (I)—(I) of FIG. 1;

FIG. 3 is a partly cut-away perspective view which explains major portions of the resin-molded semiconductor device according to the first embodiment of FIG. 1;

FIG. 4 is a diagram showing major portions of FIG. 1 on an enlarged scale;

FIG. 5 is a diagram showing major portions of FIG. 2 on an enlarged scale;

FIGS. 6A and 6B are plan views showing layouts of a semiconductor chip according to the first embodiment;

FIG. 6C is a block diagram showing major portions of FIGS. 6A and 6B; and

FIG. 7 is a plan view showing the constitution of a lead frame according to the first embodiment.

The resin-molded semiconductor device of this embodiment is constituted in a QFP (quad flat package) as shown in FIGS. 1 to 5. The resin-molded semiconductor device includes a semiconductor chip 1 of a single-crystal silicon substrate.

On the square circuit-forming surface (herein-after referred to as main surface) of the semiconductor chip 1 are formed a plurality of elements (e.g., MISFETs), the main surface being coated with an inorganic insulating film. A common inner lead 2A is laminated on the circuit-forming surface of the semiconductor chip 1 via an insulating adhesive material or an insulating tape 3. The common inner lead 2A is constituted as a unitary structure by a semiconductor chip-fastening ring $2A_1$ which firmly adheres to the semiconductor chip 1 via the insulating adhesive material or the insulating tape 3, and four hanger leads $2A_2$ that support the corners of the semiconductor chip-fastening ring $2A_1$ in a hanging manner. The semiconductor chip-fastening ring $2A_1$ has a square shape with its central portion being punched. That is, a rectangle is formed by the lead having a predetermined width. Among the four hanger leads $2A_2$, one hanger lead is formed together with an outer lead 2B as a unitary structure.

Here, the insulating adhesive material or the insulating tape 3 has a three-layer structure consisting of an adhesive of an insulating polyimide resin applied to both surfaces of an insulating polyimide resin film which has a thickness of about 25 μm.

Referring to FIGS. 1 and 4, the insulating tape 3 is adhered to the whole surface of the semiconductor chip-fastening ring $2A_1$ on the side of the semiconductor chip 1.

The insulating tape 3 may be adhered to a portion of the four sides of the semiconductor chip-fastening ring $2A_1$. Since the semiconductor chip 1, insulating tape 3 and semiconductor chip-fastening ring $2A_1$ have different coefficients of thermal expansion, the insulating tape 3 should have an area that is as small as possible such that reduced stress is exerted on the semiconductor chip 1.

On the outer side of the semiconductor chip 1 of a square shape (square periphery), a plurality of signal inner leads 4A are arranged along each of the square sides. The signal inner leads 4A are formed integrally with the outer leads 4B as a unitary structure.

The semiconductor chip-fastening ring $2A_1$ of the common inner lead 2A and the signal inner leads 4A are electrically connected to bonding pads BP formed on the main surface of the semiconductor chip 1 via connection means such as bonding wires 5 which are made of, for example, aluminum (Al) or gold (Au). The bonding wires 5 are bonded by a bonding method which consists of press-adhesion with heating combined with ultrasonic vibration.

The semiconductor chip 1, common inner lead 2A, signal inner leads 4A, bonding wires 5, and the like are molded with a resin 6, i.e., molded with a sealing material. In order to reduce the stress, the molded resin 6 is composed of an epoxy resin to which are added a phenol-type hardening agent, a silicone rubber and a filler. The silicone rubber works to decrease the modulus of elasticity of the epoxy resin as well as to decrease the coefficient of thermal expansion thereof. The filler consists of spherical silicon oxide particles and works to decrease the coefficient of thermal expansion, too. The resin 6 is molded by the transfer-molding method.

As described above, the hanger leads $2A_2$ extend from four corners of the semiconductor chip-fastening ring $2A_1$ to four corners of the molded resin 6 passing over four corners of the semiconductor chip 1. One of the four hanger leads $2A_2$ protrudes beyond the molded resin 6 to form an outer lead 2B to which a reference potential ($V_{SS}$) is applied from an external unit.

Though only one of the four hanger leads $2A_2$ is allowed to protrude beyond the molded resin 6, other hanger leads $2A_2$ may, as a matter of course, protrude beyond the molded resin 6 so as to be served with the reference potential.

The plurality of bonding pads provided on the main surface of the semiconductor chip 1 to receive the reference potential are electrically connected to the common inner lead 2A or, more specifically, to the semiconductor chip-fastening ring $2A_1$ via bonding wires.

Furthermore, the common inner lead 2A may be served with a power source potential (e.g., $V_{cc} = 50$ volts) instead of the reference potential.

The above constitution makes it possible to decrease the resistance of the wiring (inclusive of wiring the semiconductor chip 1, bonding wires 5, common inner lead and outer lead 2B) which is served with the reference potential or the power source potential. This helps prevent erroneous operation caused by noise due to a change in the reference potential or in the power source potential.

Further, the semiconductor chip-fastening ring $2A_1$ is located on a part of the chip main surface more inwardly than that of the bonding pads BP of semiconductor chip 1.

As shown in FIG. 7, the semiconductor chip 1 that can be mounted on the lead frame has such a size that the lower limit thereof permits the bonding pads BP to be arranged on the outside of the semiconductor chip-fastening ring $2A_1$ and the upper limit thereof does not come in contact with the signal inner leads 4A.

As described above, the semiconductor chip 1 is supported by the semiconductor chip-fastening ring $2A_1$ which is smaller than the outer contour of the semiconductor chip 1, and the signal inner leads 4A are so arranged as will not be overlapped on the semiconductor chip 1, making it possible to mount any kind of semiconductor chip 1 having different outer contour on the same lead frame.

It is therefore made possible to reduce the period for producing semiconductor devices as well as to provide the semiconductor devices at reduced costs.

The above semiconductor chip 1 is constituted by a logic LSI in which a logic circuit is formed by, for example, the standard cell system corresponding to ASIC (application specific integrated circuit) that is designed and fabricated to meet the user's demand as shown in FIGS. 6A to 6C. The semiconductor chip 1 constituted by the logic LSI has a size that varies depending upon the number of logic circuits that are to be mounted. That is, the size of logic cell group 11 constituting the logic circuit and the number of interface cells 12 are determined depending upon the request of a customer.

In FIGS. 6A and 6B, the logic LSI has a plurality of interface cells 12 arranged on the outermost peripheries along the square sides. FIGS. 6A and 6B illustrate the cases where there exist an equal number of interface cells 12 but the logic cell groups 11 have different sizes.

Referring to FIG. 6C, the interface cell 12A is an example of input which is constituted by a signal bonding pad BP and an input buffer circuit. An electrostatic protection circuit is provided between the signal bonding pad BP and the input buffer circuit which is connected to the logic cell group 11. The interface cell 12B is an example of output in which an output from the logic cell group 11 is connected to the bonding pad BP via the output buffer circuit. The interface cell 12C is constituted by a power source bonding pad to which the power source voltage $V_{CC}$ will be applied. The interface cell 12D is constituted by a power source bonding pad to which the reference voltage $V_{SS}$ will be applied. That is, the interface cells 12 are constituted by input and output buffer circuits, and bonding pads in the peripheral circuits of power sources. The thus constituted logic LSI has regions without bonding pad BP at corners of the square.

A logic cell group 11 is arranged on the inside of the interface cells 12. In the logic cell group 11 are arranged basic cells having a plurality of MISFETs in the X- and Y-directions. On the main surface of the logic cell group 11 is provided the aforementioned semiconductor chip-fastening ring $2A_1$ via the insulating adhesive material or the insulating tape 3. The semiconductor chip-fastening ring $2A_1$ is constituted to be arranged (e.g., in a rectangular shape) along the square sides of the semiconductor chip 1, and extends in parallel with the sides. The thus constituted semiconductor chip-fastening ring $2A_1$ is supported by four hanger leads $2A_2$ that extend over the regions (corners) where no bonding pad BP is arranged.

The common inner lead 2A, signal inner leads 4A, and outer leads 2B and 4B are formed together with the lead frame as a unitary structure as shown in FIG. 7. The semiconductor chip-fastening ring $2A_1$ of the common inner lead 2A is supported by four hanger leads $2A_2$ at the corners, the hanger leads $2A_2$ being supported by the inner frame 4C. The ends on one side of the signal inner leads 4A are supported by the inner frame 4C. The outer leads 2B and 4B are supported at both ends by the inner frame 4C and the outer frame 4D.

The common inner lead 2A, signal inner leads 4A and outer leads 2B and 4B are formed during the cutting of the lead frame. After molded with the resin 6, the lead frame is cut. The lead frame is composed of, for example Fe-Ni (Ni content of, for instance, 42 or 50%) alloy or copper.

The aforementioned insulating adhesive material 3 may be composed of, for example, a polyether amideimide-type resin instead of the epoxy-type resin. The insulating adhesive material 3 is stuck in the form of a tape onto the rectangular semiconductor chip-fastening ring $2A_1$ of the common inner lead 2A which is under the condition of the lead frame and, then, the semiconductor device is fabricated.

The resin-molded package of this type employs the so-called LOC (lead on chip) structure in which the common inner lead 2A only is arranged on the semiconductor chip 1. The resin-molded package which employs the LOC structure does not use tab, and makes it possible to seal the semiconductor chip 1 having a large size. The resin-molded semiconductor device of the present embodiment is exemplified with respect to the sectional view shown in FIG. 2, for example, using the following dimensional characteristics: A =20 mm (length of molded resin 6 of the device); B =2.5 mm (protruding distances of outer leads 4B); C =1.45 mm (thickness of portion of molded resin 6 on the inner leads 4A); D =1.1 mm (thickness of portion of molded resin 6 beneath inner leads 4A); E =0.4 mm (thickness of semiconductor chip 1); F =1.3 mm (thickness of portion of molded resin 6 on the semiconductor chip 1); G =1.0 mm (thickness of portion of molded resin 6 beneath semiconductor chip 1); H =0.4 mm (height distances separating hanger leads $2A_2$ from inner leads 4A); I =0.15 mm (thickness of lead frame); and J =2.7 mm (thickness of molded resin 6).

Furthermore, since no limitation is imposed on the structure in relation to the tab and semiconductor chip, tab and ends of inner leads, or tab and bonding wires, increased allowance is given to the size of the semiconductor chip that can be mounted on the same lead frame.

The common inner lead 2A is used for feeding, for example, Vcc or Vss, and extends in parallel within a region that is defined by the ends on the other side of the signal inner leads 4A. The semiconductor chip-fastening ring $2A_1$ of the common inner lead 2A is so constituted as to feed the power source voltage Vcc or the reference voltage Vss at any position on the main surface of the semiconductor chip. That is, the resin-molded semiconductor device is capable of reducing erroneous operation due to changes in the power source voltage Vcc or in the reference voltage Vss. The semiconductor device is further so constituted as to operate at high speeds.

Next, described below briefly is how to fabricate the resin-molded semiconductor device.

First, the insulating adhesive material 3 is adhered on the semiconductor chip-fastening ring $2A_1$ of common inner lead 2A of the lead frame on the main surface side of the semiconductor chip 1, and the lead frame is adhered to the main surface of the semiconductor chip 1.

Next, the semiconductor chip-fastening ring $2A_1$ of the common inner lead 2A, the signal inner leads 4A and the bonding pads BP on the semiconductor chip 1 are electrically connected through bonding wires 5.

Then, after molded with the resin 6, the outer leads 2B and 4B are electroplated and are cut away from the inner frame 4C and outer frame 4D of the lead frame.

Finally, among the outer leads 2B formed integrally with four hanger leads $2A_2$, three outer leads 2B are cut to complete the fabrication of the resin-molded semiconductor device.

With the resin-molded semiconductor device being constituted as described above, an increased area is offered for providing bonding pads BP on the main surface of the semiconductor chip 1 compared with that of the conventional LOC structure; i.e., the bonding pads BP can be provided in a required number.

It is further allowed to mount on the same lead frame a plurality of kinds of semiconductor chips 1 having different functions and sizes.

When the semiconductor chip 1 having a small size is mounted (FIG. 6B), the gap becomes small between the bonding pads BP and the semiconductor chip-fastening ring (common inner lead 2A) $2A_1$, whereby the bonding wires 5 can be shortened by a corresponding amount enabling the resistance of the bonding wires 5 that is a cause of power source noise to be decreased.

When the semiconductor chip 1 having a large size is mounted (FIG. 6A), on the other hand, the gap increases between the bonding pads BP and the semiconductor chip-fastening ring (common inner lead 2A) $2A_1$, and the bonding wires 5 must be lengthened. However, the bonding pads BP can be arranged in a number that is increased by an amount corresponding to the increase in the size of the semiconductor chip 1, i.e., bonding pads for power source potential or reference potential can be arranged among the interface cells 12 of FIG. 6A, making it possible to suppress the power source noise from increasing.

Furthermore, with the semiconductor chip-fastening ring $2A_1$ of the common inner lead 2A being provided nearly in parallel with the four sides of the semiconductor chip 1, it is allowed to provide at any positions the bonding pads BP that are commonly used for the power source circuit and like circuit.

The semiconductor chip-fastening ring $2A_1$ of the common inner lead 2A is disposed at the central portion on the main surface of the semiconductor chip 1 where there exists no bonding pad BP, and the four hanger leads $2A_2$ are arranged via peripheries at the corners of main surface of the semiconductor chip 1, offering an increased area for arranging the bonding pads BP.

The bonding pads BP on the main surface of the semiconductor chip 1 corresponding to the plurality of signal inner leads 4A are arranged on the outer sides of the common inner lead 2A. Therefore, the bonding wires 5 do not intersect the common inner lead 2A, and there is no probability of short-circuit between the common inner lead 2A and the bonding wires 5.

The semiconductor chip-fastening ring $2A_1$ of the common inner lead 2A is slightly lifted up above the signal inner leads 4A, and the semiconductor chip 1 is arranged nearly at the central portion such that the amounts of the molded resin 6 are balanced under and over the semiconductor chip 1. That is, since the amounts of the molded resin 6 are balanced under and over the semiconductor chip 1, development of cracks due to temperature cycle can be decreased.

Embodiment 2

Figure 8:
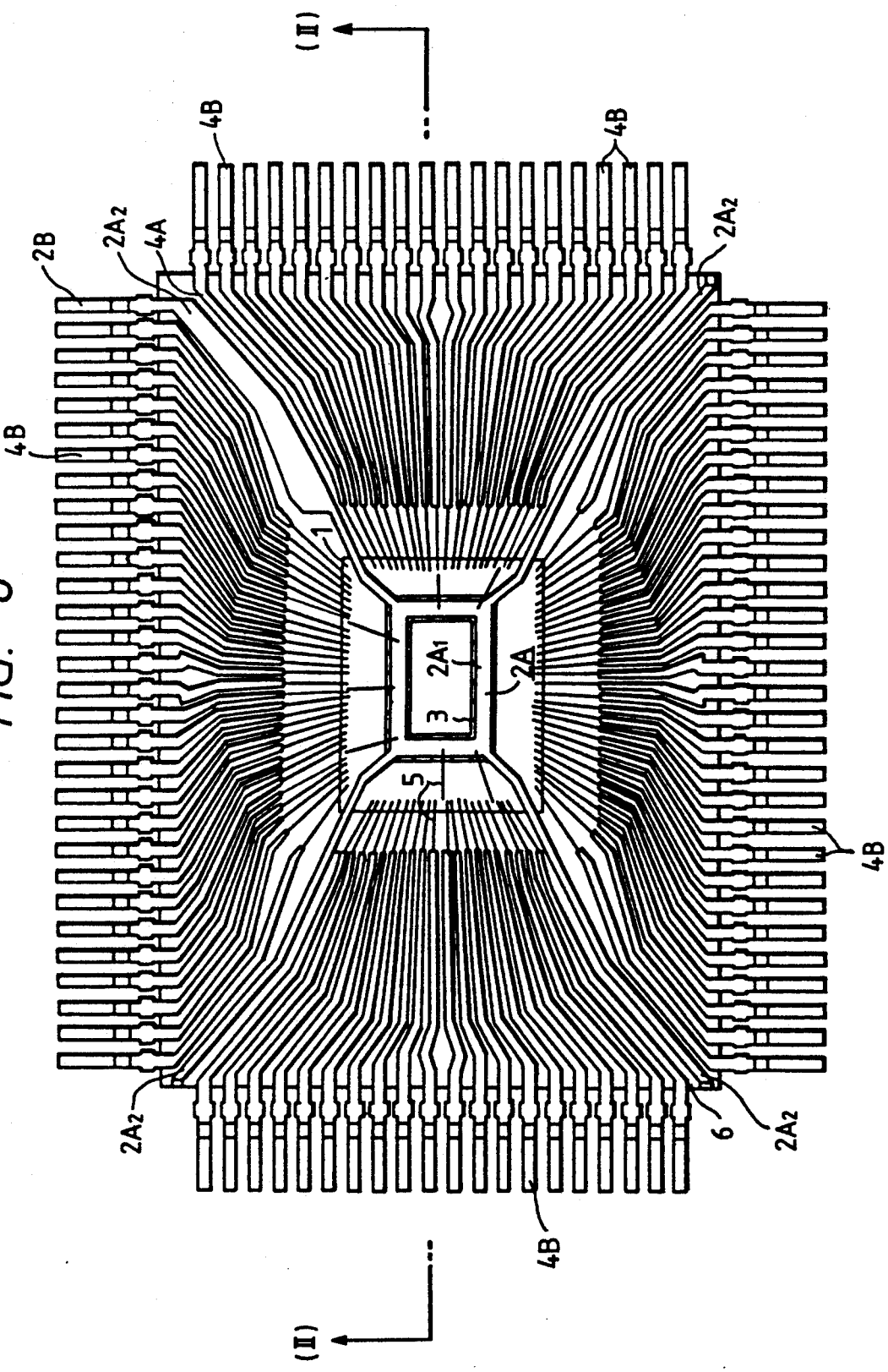
FIG. 8 is a plan view showing the whole constitution of a resin-molded semiconductor device according to a second embodiment of the present invention from which the upper half of the molded resin is removed.
Figure 9:
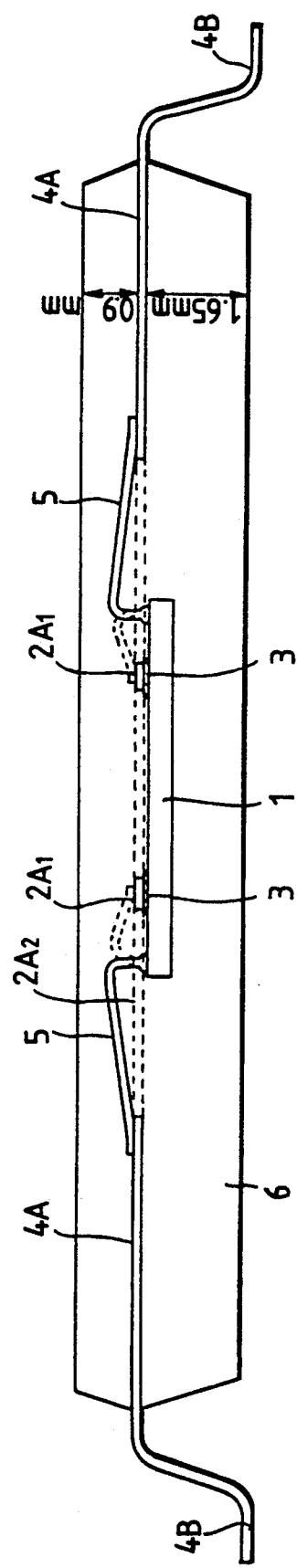
FIG. 9 is a section view cut along the line (II)—(II) of FIG. 8.

FIG. 8 is a plan view showing the whole constitution of a resin-molded semiconductor device according to a second embodiment of the present invention from which the upper half of the molded resin is removed;

FIG. 9 is a section view cut along the line II)—(II) of FIG. 8; and

Figure 10:
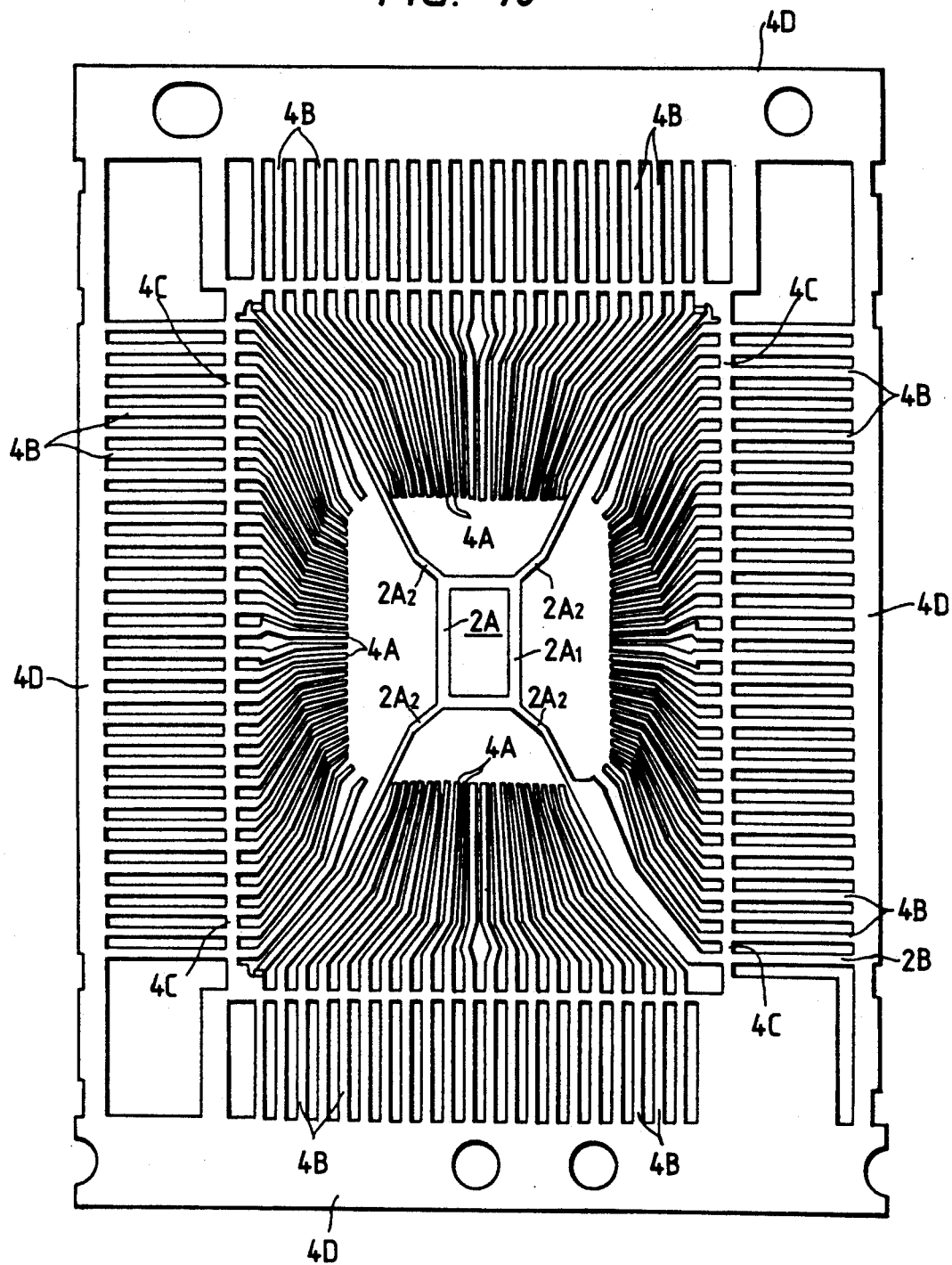
FIG. 10 is a plan view showing the constitution of a lead frame according, to the second embodiment.
Figure 11A:
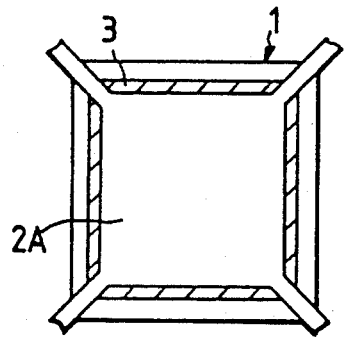
FIGS. 11(a)-11(j) are diagrams showing modified examples of a common inner lead.
Figure 11B:
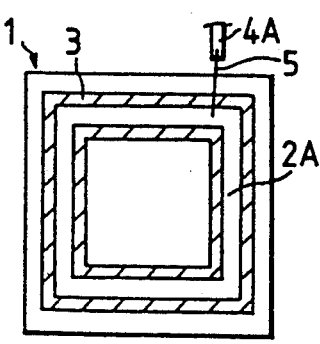
Figure 11C:
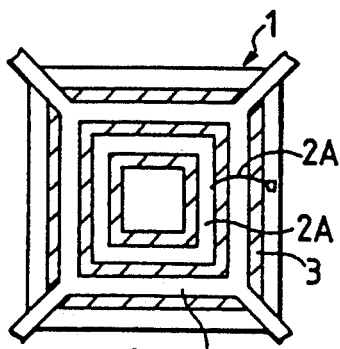
Figure 11D:
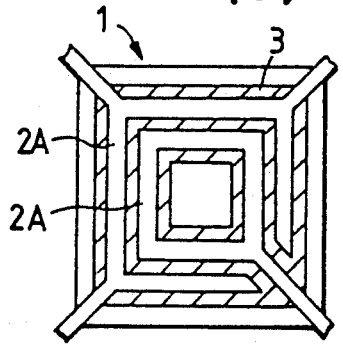
Figure 11E:
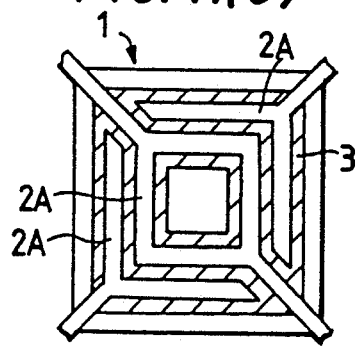
Figure 11F:
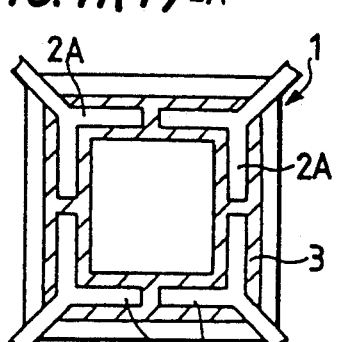
Figure 11G:
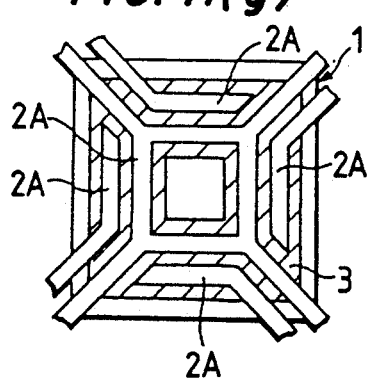
Figure 11H:
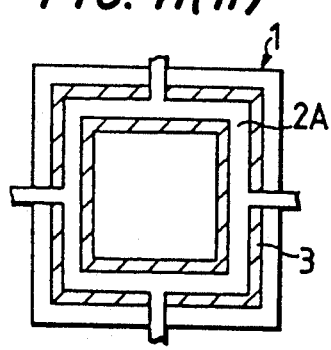
Figure 11I:
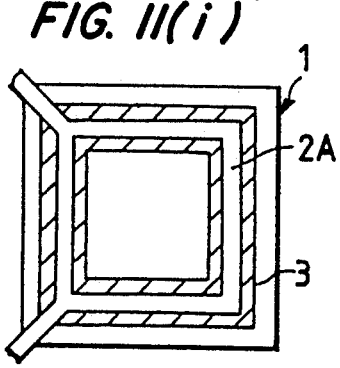
Figure 11J:
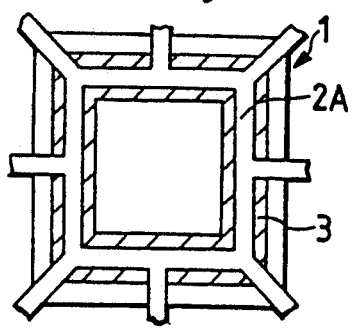

FIG. 10 is a plan view showing the constitution of a lead frame according to the second embodiment.

In the resin-molded semiconductor device according to the second embodiment as shown in FIGS. 8 to 10, the common inner lead 2A of the first embodiment is in flush with the signal inner leads 4A, and the semiconductor chip 1 is laminated via the insulating adhesive material or insulating tape 3 on the main surface thereof, yet enabling the semiconductor chip 1 to be located nearly at the central portion of the molded resin 6.

When the amounts of the molded resin 6 is balanced under and over the semiconductor chip 1, it is allowed to use a flat (flush surface) lead frame which is easily produced.

FIGS. 11(a)-11(j) show modified examples of the common inner lead 2A in the aforementioned embodiments 1 and 2. Though FIGS. 11(a)-11(j) show the semiconductor chip 1, the common inner lead 2A and adhesive material 3 thereon only, other portions are the same as those mentioned earlier. The common inner lead 2A works not only for a single power source but also for separate power sources when separated.

Figure 13:
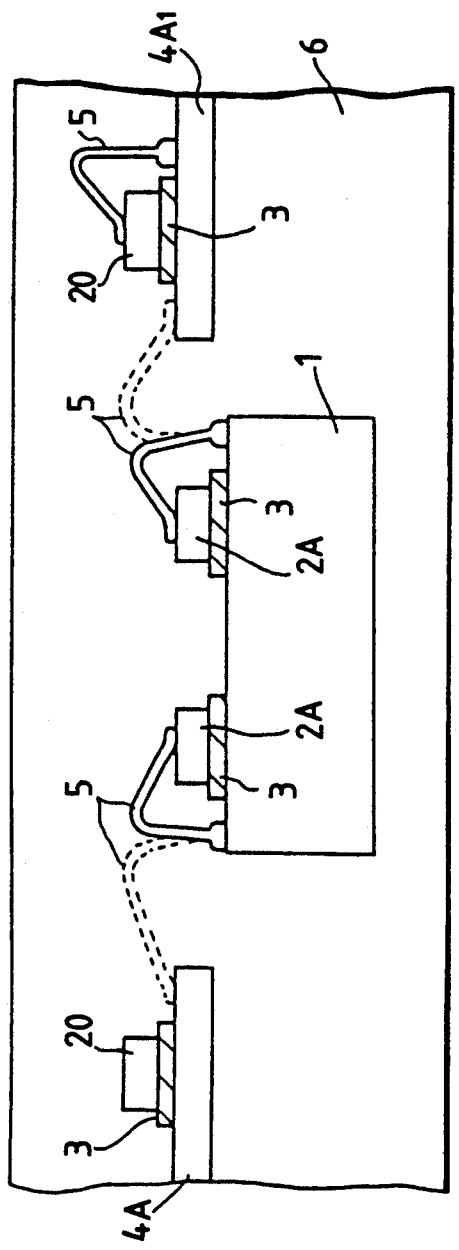
FIG. 13 is a section view cut along the line (III)—(III) of FIG. 12.

As shown in FIGS. 12 and 13 (section view cut along the line (III)—(III) of FIG. 12), furthermore, an inner lead $4A_1$ and the hanger leads $2A_2$ of the common inner lead 2A are welded together using a short bar 20 or are electrically connected together using a bonding wire, yet maintaining isolation from other inner leads 4A using the insulating adhesive tape 3 which is the same one as mentioned earlier. Thus, the common inner lead 2A and a given inner lead $4A_1$ assume the same potential through the bonding wire 5. This means that the common inner lead 2A may be used for Vcc or Vss, but the given inner lead $4A_1$ can serve as a power source pin.

The short bar 20 can also be used for reducing the resistance of the given signal inner lead $4A_1$ and of the common inner lead 2A, and further works as a heat-radiator plate.

That is, since any inner lead $4A_1$ can be set to be Vcc or Vss, it becomes easy to design the wiring of the printed board when the semiconductor device is to be mounted on the printed board.

The present invention was concretely described above by way of embodiments, but it should be noted that the present invention is in no way limited to the above embodiments only but may be modified in a variety of other ways without departing from the spirit and scope of the invention.

For example, the present invention can be adapted to a glass-molded semiconductor device in which a semiconductor chip is sealed with a glass in a cavity molded with a ceramic.

Briefly described below are the effects obtained by representative examples of the invention disclosed in this application.

Compared with the device of the conventional LOC structure, an increased area is offered for providing bonding pads on the circuit-forming surface of the semiconductor chip, and a multi-pin semiconductor device is realized.

Since no tab is used, there is provided a highly reliable semiconductor device free from the probability of short-circuit between the tab and the bonding wires.

Furthermore, since the bonding pads for power source potential or reference potential can be provided at any positions, the power source potential or the reference potential is prevented from varying.

Since the number of signal inner leads can be increased, there is provided a multi-pin semiconductor device.

Since the bonding wires do not intersect the common inner lead, there is no likelihood of short-circuit between the common inner lead and the bonding wires making it possible to provide a highly reliable semiconductor device.

Furthermore, there is provided a semiconductor device having a thickness smaller than that of the semiconductor devices of the conventional LOC structure.

The common inner lead helps decrease the resistance of wiring for power source potential or reference potential, and hence decrease the noise caused by a change in the power source potential or reference potential.

A plurality of kinds of semiconductor chips having different functions and sizes can be mounted on the same lead frame, and the cost can be decreased owing to the aforementioned effects. Moreover, the semiconductor device can be manufactured within short periods of time.

What is claimed is:

1. A semiconductor device comprising:
   a semiconductor chip having a square main surface and a plurality of elements and first and second bonding pads on said main surface, said first and second bonding pads being arranged along the periphery of the square main surface of said semiconductor chip;
   a sealing material that covers said semiconductor chip;
   a plurality of first leads having first and second ends, said first ends being positioned near said semiconductor chip and said second ends being positioned outside of said sealing material;

a second lead extending on the main surface of said semiconductor chip, wherein said first and second leads are disposed such that said periphery of the square main surface of said semiconductor chip is positioned between the first ends of said first leads and said second lead; and first bonding wires positioned inside said sealing material and electrically connecting said first bonding pads to the first ends of said first leads, and second bonding wires positioned inside said sealing material and connecting said second bonding pads to said second lead.

2. A semiconductor device according to claim 1, wherein said second lead is positionally disposed on the square main surface of said semiconductor chip more inwardly than that of said first and second bonding pads.

3. A semiconductor device according to claim 2, wherein said second lead is adhered onto the main surface of said semiconductor chip via an insulating film.

4. A semiconductor device according to claim 3, wherein said sealing material has a square flat surface.

5. A semiconductor device according to claim 4, wherein said first leads are disposed to protrude outwardly from the four sides of said sealing material.

6. A semiconductor device according to claim 5, wherein said first and second bonding pads are arranged along each of four sides of said square semiconductor chip.

7. A semiconductor device according to claim 6, wherein input/output buffers are respectively arranged close to corresponding ones said first bonding pads.

8. A semiconductor device according to claim 7, wherein said second lead includes a portion which extends toward the outside of said semiconductor chip from a corner of said semiconductor chip.

9. A semiconductor device according to claim 8, wherein said second lead is supplied with a reference potential.

10. A semiconductor device according to claim 8, further comprising an additional second lead extending on the main surface of said semiconductor chip and being electrically independent of said second lead.

11. A semiconductor device according to claim 10, wherein said additional second lead is served with a power source voltage.

12. A semiconductor device comprising:

a semiconductor chip having a square main surface and a plurality of elements and first and second bonding pads on said main surface, said first and second bonding pads being arranged along the periphery of the square main surface of said semiconductor chip;

a sealing material that covers said semiconductor chip;

a plurality of first leads having first and second ends, and extending in directions substantially perpendicular to the four sides of the square semiconductor chip, said first ends being positioned near said semiconductor chip and said second ends being positioned outside of said sealing material;

a second lead extending on the main surface of said semiconductor chip, wherein said first leads and a main portion of said second lead are disposed such that said periphery of the square main surface of said semiconductor chip is positioned between the first ends of said first leads and the main portion of said second lead;

a third lead positioned inside said sealing material and outside of said chip, extending in a direction substantially perpendicular to that of said first leads and that of another portion of said second lead, wherein said another portion of said second lead is integrally formed with said main portion thereof and is disposed to extend toward the outside of said semiconductor chip, and wherein said third lead is electrically connected to said second lead; and first bonding wires positioned inside said sealing material and electrically connecting said first bonding pads to the first ends of said first leads, and at least one second bonding wire positioned inside said sealing material and electrically connecting said second bonding pads to said second lead, wherein said third lead is electrically connected to one of said first leads.

13. A semiconductor device according to claim 12, wherein said first lead connected to said third lead is supplied with a reference potential.

14. A semiconductor device according to claim 13, wherein said third lead and said first leads are electrically isolated from each other via an 15. A semiconductor device according to claim 14, wherein the first lead connected to said third lead is not connected to said first bonding pad.

* * * * *